(12) United States Patent
Tsunoda

(10) Patent No.: US 6,518,159 B1
(45) Date of Patent: Feb. 11, 2003

(54) SEMICONDUCTOR LASER DEVICE AND A METHOD FOR FABRICATING THE SAME

(75) Inventor: Atsuo Tsunoda, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 105 days.

(21) Appl. No.: 09/691,060

(22) Filed: Oct. 19, 2000

(30) Foreign Application Priority Data

Oct. 28, 1999 (JP) .................................... 11-307592
Sep. 28, 2000 (JP) ................................. 2000-296629

(51) Int. Cl.$^7$ .................. H01L 21/00; H01L 21/3205; H01L 21/28
(52) U.S. Cl. ..................... 438/604; 438/44; 438/46; 438/607
(58) Field of Search ........................... 438/604, 607, 438/42, 44, 46

(56) References Cited

U.S. PATENT DOCUMENTS

| | | | | |
|---|---|---|---|---|
| 5,029,175 A | * | 7/1991 | Ohnaka et al. | 372/46 |
| 5,310,697 A | * | 5/1994 | Kan et al. | 437/129 |
| 5,474,954 A | * | 12/1995 | Yang | 437/129 |
| 5,805,627 A | * | 9/1998 | Kubota et al. | 372/46 |
| 6,100,544 A | * | 8/2000 | Lin et al. | 257/94 |
| 6,323,052 B1 | * | 11/2001 | Horie et al. | 438/46 |
| 6,387,721 B1 | * | 5/2002 | Hashimoto et al. | 438/46 |
| 6,406,932 B2 | * | 6/2002 | Lee et al. | 438/46 |

FOREIGN PATENT DOCUMENTS

| | | |
|---|---|---|
| JP | 2-168690 | 6/1990 |
| JP | 2-260682 | 10/1990 |
| JP | 5-067839 | 3/1993 |
| JP | 06275915 A | 9/1994 |
| JP | 06296062 | 10/1994 |
| JP | 7-022696 | 1/1995 |
| JP | 7-050452 | 2/1995 |
| JP | 07050453 | 2/1995 |
| JP | 8-181385 | 7/1996 |
| JP | 08228041 | 9/1996 |
| JP | 08228047 | 9/1996 |

\* cited by examiner

Primary Examiner—Alexander Ghyka
(74) Attorney, Agent, or Firm—Nixon & Vanderhye P.C.

(57) ABSTRACT

An object of the present invention is provide an InGaAlP-based semiconductor layer of a good crystal quality at a higher temperature up to a re-evaporating temperature by MBE process. A buffer layer made of GaAs and a buffer layer made of GaInP are formed by MBE (molecular beam epitaxy) process on a GaAs substrate having a facet, which is to be a main facet, inclined by θ in [011] direction from (100) facet. Then semiconductor layers are formed by MBE process so as to include cladding layers having a bandgap $E_{gc}$ and an AlGaInP active layer having a bandgap $E_{ga}$ which is adjusted by an amount of III-group element to be represented by $E_{ga} < E_{gc}$. The semiconductor laser device has a ridge stripe extending in [01-1] direction.

8 Claims, 5 Drawing Sheets

SEMICONDUCTOR LASER DEVICE AND A METHOD FOR FABRICATING THE SAME

BACKGROUND OF THE INVENTION

The present invention relates to a semiconductor laser device made of AlGaInP or its analogues and a method for fabricating the same. In particular the present invention relates to a semiconductor laser device made by utilizing MBE process which may grow an AlGaInP-based layer at a lower temperature to provide an improved crystal quality, a lower threshold in oscillation and a high efficiency in light emission and a method for fabricating the same.

AlGaInP-based semiconductor laser devices are used as optical sources for optical disc systems, laser printers, bar-code readers and the like, accordingly researches and developments for such devices have been enthusiastically carried out. There are some prior patents relating to AlGaInP semiconductor laser devices and a method for fabricating the same, such as Japanese Laid-Open Patent Publication No. 8-228041, Japanese Laid-Open Patent Publication No. 8-228047, Japanese Laid-Open Patent Publication No. 6-296062, Japanese Laid-Open Patent Publication No. 2-168690, Japanese Laid-Open Patent Publication No. 8-181385, Japanese Laid-Open Patent Publication No. 5-67839, Japanese Laid-Open Patent Publication No.7-50453, Japanese Laid-Open Patent Publication No. 7-50452, Japanese Laid-Open Patent Publication No. 7-22696 and Japanese Laid-Open Patent Publication No. 6-275915.

In the above patents, MOCVD process has been mainly used for growing AlGaInP crystal layers which are utilized to construct AlGaInP-based semiconductor laser devices, since the MOCVD process has provided better crystal qualities than MBE process which is one of major crystal growth processes. While the MBE process provides a higher carrier density in p-type semiconductor layers where the carrier density is important to improve electric characteristics in semiconductor laser devices and utilizes Be of a lower diffusion as an impurity to achieve such carrier density so as to realize a semiconductor laser devise of long-term reliability. There are two major advantages of the MBE process. For these reasons, an improvement in crystal qualities for crystals grown by the MBE process is effective to obtain an improved characteristic of AlGaInP-based semiconductor laser devices.

Now, AlGaInP-based semiconductor laser devices by MBE (molecular beam epitaxy) process will be described hereinafter.

FIGS. 1 to 4 are respectively a part of a flow chart illustrating a conventional process for fabricating AlGaInP semiconductor laser devices. FIGS. 5 to 7 also are respectively a part of a flow chart continuing from FIGS. 1 to 4 for illustrating the conventional process.

As shown in FIG. 1, an n-type $(Al_{0.72}Ga_{0.28})_{0.51}In_{0.49}$ cladding layer 22, a $Ga_{0.51}In_{0.49}P$ active layer 23, a first p-type $(Al_{0.72}Ga_{0.28})_{0.51}In_{0.49}P$ cladding layer 24, a non-dope $Ga_{0.62}In_{0.38}P$ etch-stop layer 25, a second p-type $(Al_{0.72}Ga_{0.28})_{0.51}In_{0.49}P$ cladding layer 26, a p-type $Ga_{0.51}In_{0.49}P$ intermediate layer 27 and a p-type GaAs cap layer 28 are successively grown by the MBE process at a temperature of 450° C. on amain facet of an n-type GaAs substrate 21 which has a facet-direction (100) just aligned in place. Then an $Al_2O_3$ layer 29 is deposited on the cap layer 28.

Then, a resist layer 30 is applied onto the $Al_2O_3$ layer 29 for photoetching to obtain stripe-shaped $Al_2O_3$ layer 29 by a pattern process. As shown in FIG. 2, an etching process follows using the $Al_2O_3$ layer 29 as a mask to partially remove the cap layer 28, the p-type $Ga_{0.51}In_{0.49}$ intermediate layer 27 and the second p-type $(Al_{0.72}Ga_{0.28})_{0.51}In_{0.49}P$ cladding layer 26 so as to form a ridge beneath the $Al_2O_3$ layer. Then, as shown in FIG. 3, after removing the resist layer 30, a second MBE process is carried out to form an n-type GaAs current blocking layer 31 at the both sides of the ridge.

During the second MBE process, a GaAs crystal 32 of a polycrystalline is grown on the surface of the $Al_2O_3$ layer 29. The a resist layer 33 is applied by a spinner wherein the resist layer 33 is not substantially applied on the polycrystalline GaAs crystal 32 but on the current blocking layer 31. Subsequently, the resist 33 on the whole surface is ashed by $O_3$-UV to have the resist 33 coated only on the n-type GaAs current blocking layer 31 as shown in FIG. 4.

Then, as shown in FIG. 5, the polycrystalline GaAs crystal 32 is removed by etching by using the resist 33 as a mask. Subsequently, the resist 33 is removed and the $Al_2O_3$ layer 29 is also removed by etching as shown in FIG. 6. Next, a third MBE process is carried out to form a contact layer 34. Finally electrodes 35 and 36 are formed respectively on the top of the array obtained as described above and on the back of the n-type GaAs substrate 21 to obtain an AlGaInP-based semiconductor red-laser device as shown in FIG. 7.

Since MBE process supplies metal material in molecules, it allows the metal to grow at a lower temperature comparing with an MOCVD (Metal Organic Chemical Vapor Deposition which is also a type of chemical vapor deposition) where a material is supplied in an organic metal. Further, the MOCVD process allows the metal to grow only at a temperature ranging from 600° C. to 700° C. which is higher than the decomposition temperature of the organic metal. In other words, the growth temperature must be higher than 520° C. which is the evaporating temperature of In atoms, whereby the thickness of the grown crystal becomes smaller comparing with the supplied In. That is to say, the crystal is grown during re-evaporation of itself. Once re-evaporation of the crystal happens, its compound crystal rate is varied not only by material supply but also by its growth temperature, thereby making it difficult to control characteristics of a semiconductor laser device, such as oscillating wave-length.

However, even by using MBE process it is still preferable to grow a crystal at a higher temperature in order to improve crystal qualities. If an AlGaInP-based material is grown at a temperature lower than 400°C., for example, a specific resistance of the crystal is too large to fabricate a semiconductor laser device because metal molecules of the material do not seem to locate in place, resulting in a poor crystal quality.

While, a substrate having an aligned facet-direction of (100) obtained by MBE growth process at a higher than 480° C. gives a wide spectrum of photoluminescence (referred to as PL hereinafter) which is unfavorable for a crystal applied to a semiconductor laser device.

Further, an AlGaInP-based semiconductor layer grown in the conventional manner tends to be affected by impurities on a GaAs substrate surface, resulting in a poor morphology, causing a crystal defect and the like.

SUMMARY OF THE INVENTION

An object of the present invention is to provide a semiconductor laser device having a lower oscillation threshold and a high light-emission efficiency by growing AlGaInP-based semiconductor layers on a GaAs substrate having a facet, which is to be a main facet, inclined by θ° in [011] direction from (100) facet, that is to say, by growing AlGaInP semiconductor layers of a good crystal quality.

Another object of the present invention is to provide a semiconductor fabricating method which permits growing at a lower temperature than the re-evaporation temperature of In, thus improving the crystal quality of AlGaInP-based semiconductor device by MBE growth process allowing a small deviation in compound crystal ratios to give a stable characteristic and which has less influence by impurities on a GaAs substrate surface, thereby giving a good morphology when growing an AlGaInP-based semiconductor layer to lessen crystal defects.

Still another object of the present invention is to provide a semiconductor laser device having a cladding layer of bandgap $E_{gc}$ made of III-V group compound semiconductor layer and an active layer of bandgap $E_{ga}$ which are stacked on a substrate having a facet, which is to be a main facet, inclined by θ in [011] direction from (100) facet so as to form a ridge stripe wherein the relationship between the bandgaps $E_{ga}$ and $E_{gc}$ is represented by $E_{ga}<E_{gc}$ and the extending direction of the ridge stripe is [01-1].

Further, another object of the present invention is to provide a semiconductor laser device wherein the angle θ° inclined in [011] direction from (100) facet is between 7° and 15°.

Another object of the present invention is to provide a semiconductor laser device wherein a cross-sectional shape of the ridge stripe is asymmetric along an axis extending in the stacked direction of the III-V group compound semiconductor layers in the cross section.

Another object of the present invention is to provide a semiconductor laser device wherein a cross-section shape of the ridge stripe has a larger width which is closer to the active layer and a smaller width which is farther from the active layer and acute angles out of angles formed by a stack facet and both sides of the ridge stripe respectively are 54.7°±θ°.

Still another object of the present invention is to provide a semiconductor device wherein the active layer is a GaInP/AlGaInP multiple quantum well and the cladding layer is AlGaInP-based.

Another object of the present invention is to provide a semiconductor laser device wherein the substrate is GaAs-based and has a buffer layer made of GaAs and formed thereon.

Another object of the present invention is to provide a semiconductor laser device wherein the substrate is GaAs-based and has a buffer layer made of GaAs and another buffer made of GaInP and formed thereon.

Still another object of the present invention is to provide a semiconductor laser device including the steps of stacking a cladding layer of bandgap $E_{gc}$ made of III-V group compound semiconductor layer and an active layer of bandgap $E_{ga}$ on a substrate having a facet, which is to be a main facet, inclined by θ° in [011] direction from (100) facet that formed a ridge stripe wherein the method comprises the steps of extending the ridge stripe in [01-1] direction and chemically fabricating the ridge stripe by chemically etching.

Another object of the present invention is to provide a semiconductor laser device wherein III-V group compound semiconductor layers including the cladding layer and the active layer are formed by MBE process.

Another object of the present invention is to provide a semiconductor laser device wherein the growth temperature of GaInP, AlGaInP semiconductor layers by the MBE process is between 400° C. and 520° C.

PREFERRED EMBODIMENT OF THE INVENTION

Figure 1:
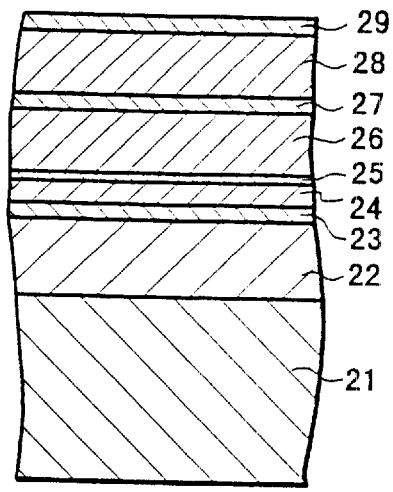
FIGS. 1 to 7 are respectively a part of a flow chart illustrating a conventional fabricating process.
Figure 2:
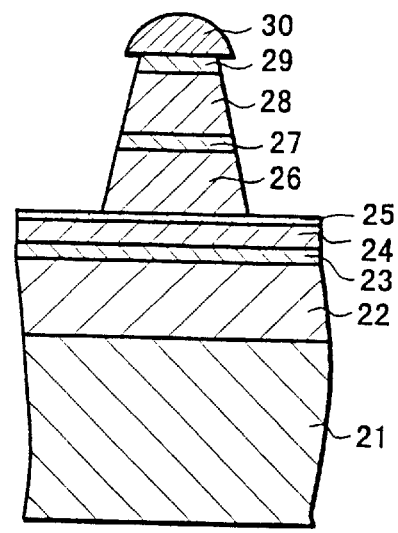
Figure 3:
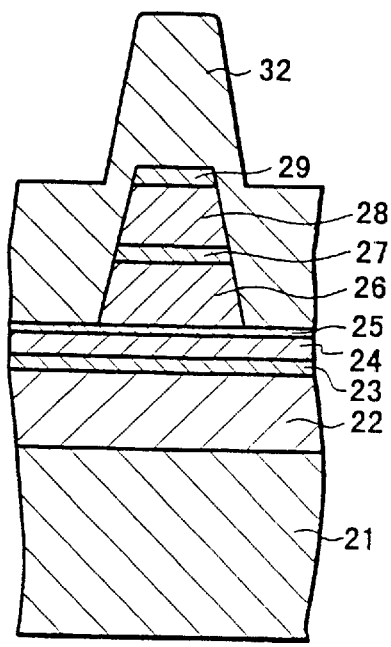
Figure 4:
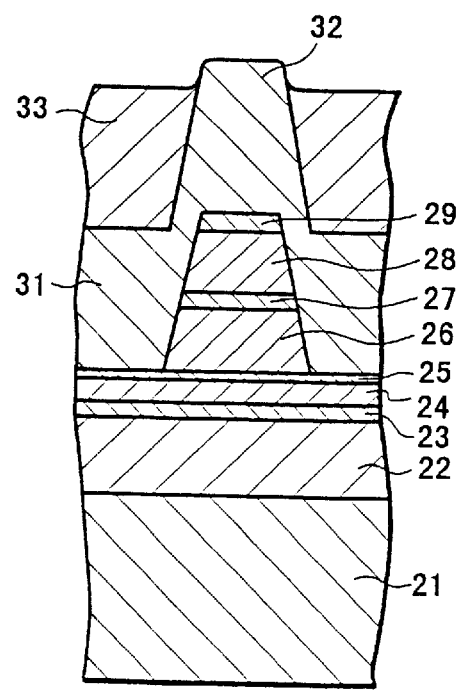
Figure 5:
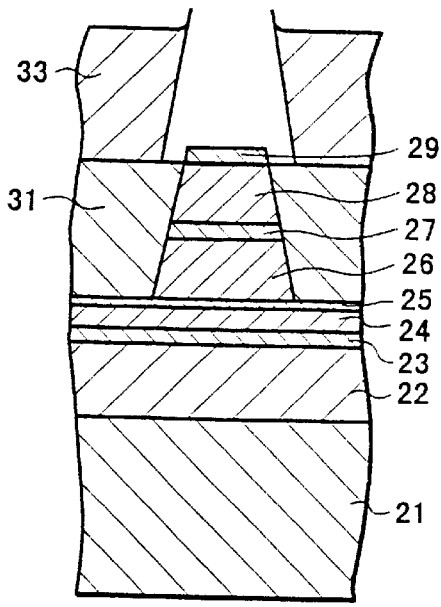
Figure 6:
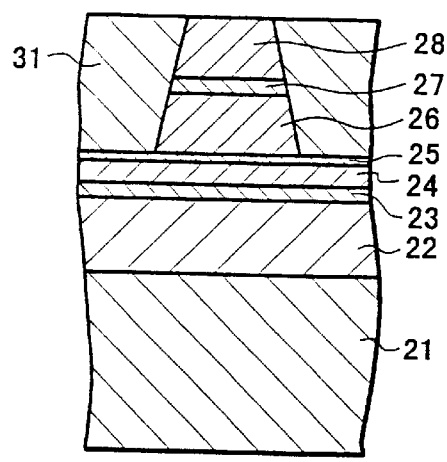
Figure 7:
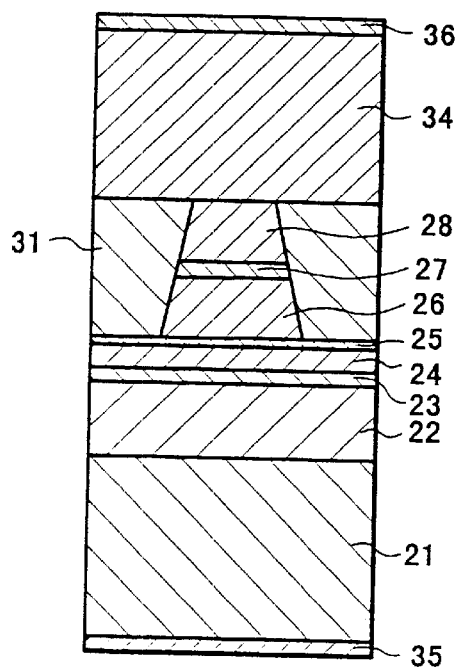
Figure 8:
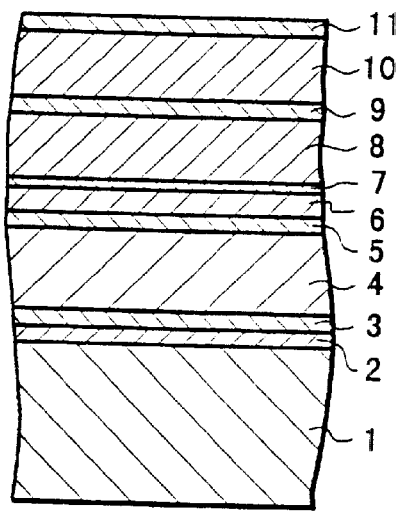
FIGS. 8 to 14 are respectively a part of a flow chart illustrating a fabrication method of a working example of the present invention.
Figure 9:
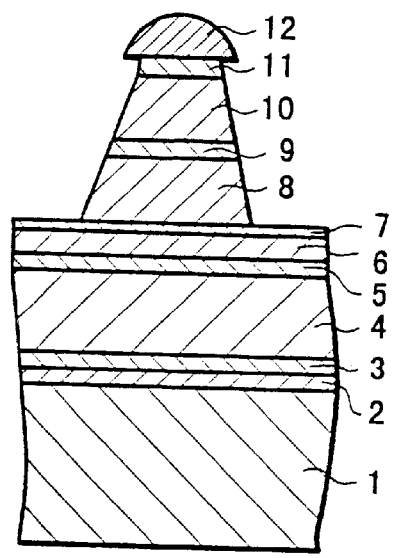

The present invention provides a semiconductor laser device having a cladding layer of bandgap $E_{gc}$ made of III-V group compound semiconductor layer and an active layer of bandgap $E_{ga}$ which are stacked on a substrate having a facet, which is to be a main facet, inclined by θ° in [011] direction from (100) facet, wherein $E_{ga}$ and $E_{gc}$ is represented by $E_{ga}<E_{gc}$, the device includes a ridge stripe and the extending direction of the ridge stripe is [01-1] direction. And the semiconductor laser device is fabricated by MBE process.

According to the inventors' enthusiastic researches and developments, the inventors have found that the larger the angle θ° inclined in [011] direction from (100) facet of GaAs substrate is, the higher the growth temperature to spread a PL spectrum of an AlGaInP-based semiconductor layer grown on the substrate becomes. In other words, a substrate of an aligned facet-direction (100) in place results in 83 meV, 94 meV and 130 meV in half-value-width of PL spectrum respectively at 480° C., 500° C. and 520° C. of growth temperatures. While, a substrate of 15°inclination of the facet-direction in [011] direction from (100) results in 79 meV, 66 meV and 68 meV in half-value-width of PL spectrum respectively at 480° C., 500° C. and 520° C. of growth temperatures. Therefore, we have found that the inclined substrate gives narrower width at each growth temperature below 520° C.—which is a re-evaporation point of In—so that the crystal quality is improved.

As is well-known in the art, one of the important characteristics in semiconductor lasers is a temperature characteristic TO which is a parameter to represent temperature dependence of an oscillation threshold. The larger the parameter is, the more practical the semiconductor laser is. To increase the TO, it is necessary to make a bandgap $E_{gc}$ of a cladding layer larger than a bandgap $E_{ga}$ of an active layer as much as possible. For example, in an AlGaInP-based semiconductor device in which an active layer is GaInP (a well layer should be considered since the well layer contributes to light emission in a quantum well active layer) and a cladding layer is AlGaInP, an Al compound crystal ratio is set at 0.367 (the ratio is 0.72 to Ga, and the total ratio of Ga and Al is 0.51 to In) which practically decreases the bandgap because of an indirect transition so as to increase $E_{gc}$ as much as possible. Incidentally, the bandgap of the active layer is constant because it is conformed to a preset wavelength. Therefore, there is no other way than to increase $E_{gc}$ in order to increase the TO.

In an AlGaInP-based semiconductor layer, if a ratio of In in III-group elements (except for P) is 0.49, GaAs substrate and crystal lattice of the layer are the same in length, that is a lattice matching crystal. Relative amounts of Al and Ga do not practically change the length of the crystal lattice but the bandgap of the layer.

Note that since the In ratio of quantum well in the preferred embodiments of the present invention is set at 0.52 that gives a larger crystal lattice than a GaAs substrate, resulting in a strained-layer superlattice with added compression strain.

As is well known in the art, AlGaInP(500 Å) in an active layer is a guide layer for enclosing light, and AlGaInP(50 Å×) therein are barrier layers to separate a quantum well layer so as to cause quantum effect.

If the angle θ inclined in [011] direction from (100) facet is increased, so-called natural superlattice is not formed so that even constant compound crystal ratios in GaInP active layers and AlGaInP's increase bandgaps regardless of whether it is a quantum well structure, and also regardless of whether a compression strain, a tension strain or the like is added.

Therefore, to fix an oscillation wave-length, if the bandgap of an active layer is adjusted with thickness, strains or composition of the layer, TO may be increased by increasing θ and bandgaps of a cladding layer. In crystals grown by MBE process, the angle inclined in [011] direction from (100) facet of GaAs substrate begins to cause bandgap-increasing effect from about 7°.

Further, in the method of the present invention for fabricating semiconductor laser devices, a buffer layer made of GaAs is formed by MBE process on a GaAs substrate having a facet, which is to be a main facet, inclined by 7°–15° in [011] direction from (100) facet. Then semiconductor layers including an AlGaInP cladding layer of which bandgap is $E_{gc}$ and an AlGaInP active layer having a bandgap of $E_{ga}$ which is adjusted by the amount of III-group to represent $E_{ga}<E_{gc}$ are formed by MBE process.

It is preferable to set the angle θ° inclined in [011] direction from (100) facet of the GaAs substrate at 10°–15° in view of an improved crystal quality in the active layer, however, the angle may be set at 7°–15° to prevent a natural superlattice forming.

Further, in the method of the present invention for fabricating a semiconductor laser device, a buffer layer made of GaAs and a buffer layer made of GaInP are formed by MBE process on a GaAs substrate having a facet, which is to be a main facet, inclined by 7°–15° in [011] direction from (100) facet. Then semiconductor layers including an AlGaInP cladding layer of which bandgap is $E_{gc}$ and an AlGaInP active layer having a bandgap of $E_{ga}$ which is adjusted by the amount of III-group to represent $E_{ga}<Eg_{gc}$ are formed by MBE process, wherein a growth temperature for an AlGaInP-based semiconductor layer is set at 400° C.–520° C.

As mentioned above, when an AlGaInP-based semiconductor layer is grown by MBE process on a GaAs substrate having a facet, which is to be a main facet, inclined by θ° in [011] direction from (100) facet, a PL spectrum of an AlGaInP-based semiconductor layer thereon may be narrow, and a growth temperature may be raised up to 520° C. which is the evaporating temperature of In. In other words an InGaAlP layer of an improved crystal quality may be grown. Therefore, a semiconductor laser device having improved characteristics such as a lower oscillation threshold and a high light-emission efficiency may be fabricated.

Further, MBE process provides a lower temperature growth comparing with MOCVD process which is also a type of chemical vapor deposition. It achieves easy control of composition on each growth layer. The reason is that when an AlGaInP-based semiconductor layer is grown by a conventional MOCVD process, the growth temperature is set at as high as 600° C.–700° C. to obtain a certain level of crystal quality for a light emitting device. However, a re-evaporation of In takes place during the growth. Thus, it is necessary to maintain the re-evaporation at a constant level in order to manage a correct compound crystal ratio. Accordingly, it is necessary to control not only material supply in general but also a correct growth temperature. While, it is difficult to maintain such correct temperature at high so that deviations among compound crystal ratios may be large particularly. When AlGaInP-based layers are grown by MBE process, it is possible to grow such layers at as low as 400 ° C. –520° C. in which In does not re-evaporate in order to maintain a crystal quality at a certain level for a light emitting device, According to the present invention, when an extending direction of ridge stripe is selected to orthogonally cross a direction which inclines a main facet, a cross-sectional shape of the ridge looks like an ordinary mesa where the top is narrower. When the extending direction of the ridge stripe is [011] direction, and an end surface formed by cleavage does not become perpendicular to a light waveguide to tilt an output laser beam against the substrate surface, making it difficult to use the device as a light source for optical disc systems. A cross-sectional shape of the ridge looks like a reverse mesa where the top is broader. Since molecular beams in MBE process go straight, the reverse-mesa having a broader top does not allow material elements to reach a lower portion of the ridge, causing cavities in a grown crystal. While such ordinary mesa having a narrower top allows a crystal to grow to cover the ridge without leaving any gaps so that such cavities are not formed. Therefore, laser lights are enclosed in a certain space near the ridge stripe and a semiconductor laser device having an improved optical characteristic may be fabricated.

However, an inclined angle of more than 15° makes the asymmetry between right and left inclined angles of a generally used buried ridge worse to cause a transverse mode of a laser beam to be unstable. Then the inclined angle is preferably 7°–15°, and the most preferable angle is 15°.

According to the present invention, when a buffer layer of GaAs which is the same compound as a substrate is fabricated by MBE process capable of growing an improved crystal, possible adverse effects by impurities on the GaAs substrate surface may be avoided, contrary to growing an AlGaInP-based semiconductor layer. In MBE process, it is necessary to move the substrate among growth chambers after growing a GaAs buffer in order to grow an AlGaInP-based layer. Thus, the growth is stopped for a while, which tends to cause a contamination of impurities onto the surface. Another contamination may happen to a moving wafer. Therefore, an AlGaInP cladding layer of a high-Al compound crystal ratio which is active should not be grown immediately on the surface but a GaInP buffer layer should be grown at first, whereby a good morphology of an AlGaInP-based semiconductor layer may be obtained to lessen crystal defects.

A working example of the present invention will be described referring to FIGS. 8 to 14.

Figure 10:
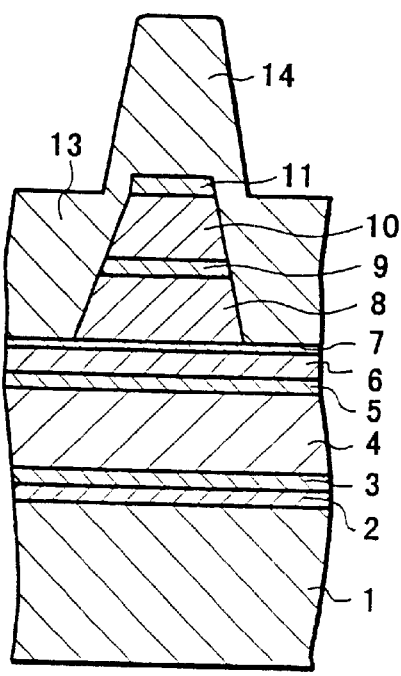
Figure 11:
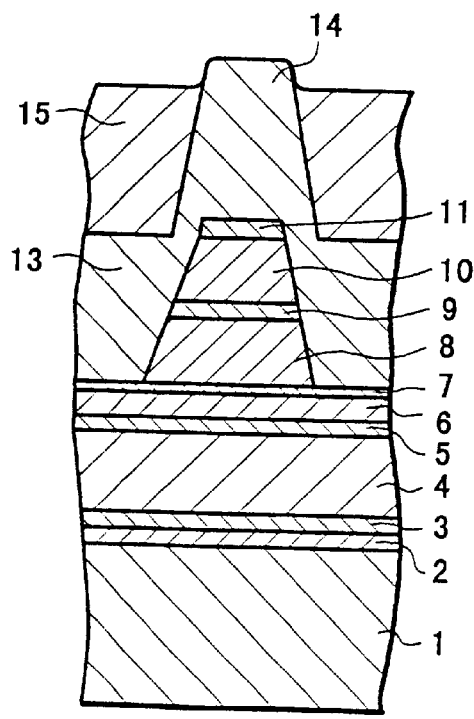
Figure 12:
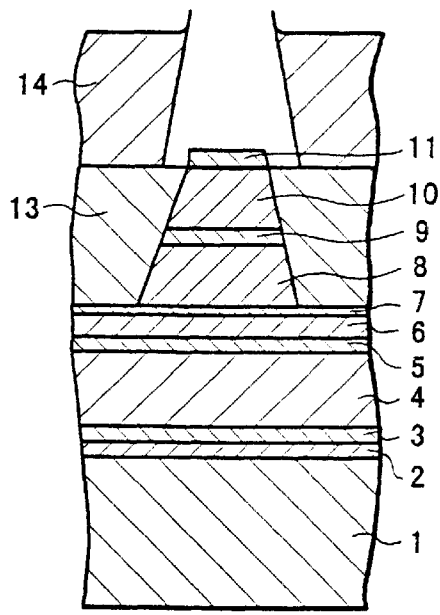
Figure 13:
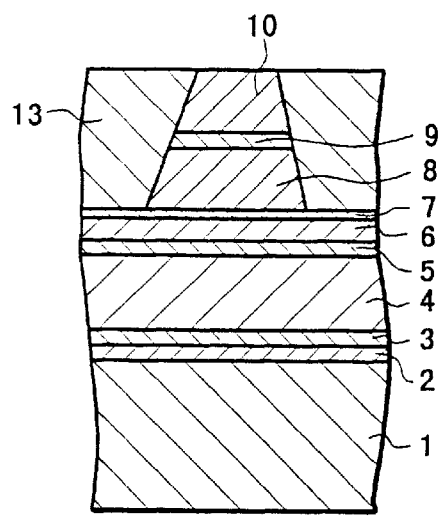
Figure 14:
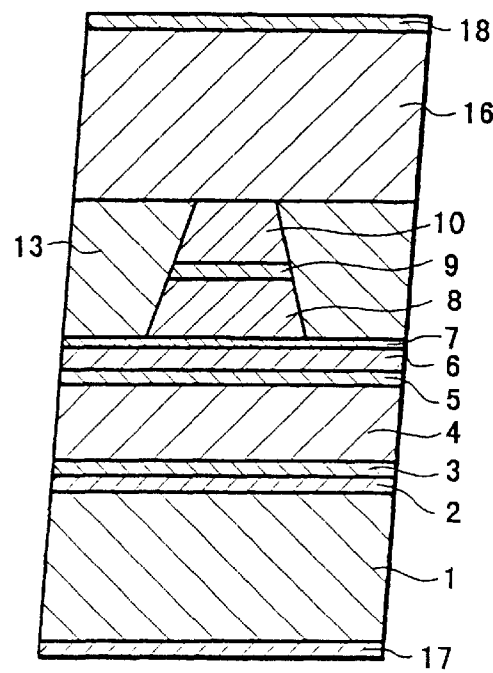

FIGS. 8 to 11 are respectively a part of a flow chart illustrating a method of the present invention for fabricating AlGaInP semiconductor laser devices. FIGS. 12 to 14 also are respectively a part of a flow chart continuing from FIGS. 8 to 11 for illustrating the present invention. In actual fabricating processes of the present invention, since many devices are aligned on the same substrate to form them at a time to separate them apart at the last process, both sides of each device as shown in FIGS. 8 to 14 (also in FIGS. 1 to 7) is defined with waved lines.

An AlGaInP-based semiconductor device according to the present working example is an example where its oscillating wave-length is set at 650 nm, which may be fabricated by the following series of steps, for example.

To begin with, an n-type GaAs buffer layer 2 is stacked by 0.25 $\mu$m at 600° C. by means of MBE process on an n-type GaAs substrate 1 having a facet, which is to be a main facet, inclined by 15° in [011] direction from (100) facet. A GaAs buffer layer 2 is stacked within a growth chamber where only As is used as a V-group element. Then, under a vacuum condition, the GaAs substrate 1 stacked with the GaAs buffer 2 is moved into another growth chamber where only P is used as a V-group element. Since the substrate 1 is moved under the vacuum condition to grow the buffer layer 2 not including Al which is active, a poor crystal quality caused by a possible contamination during the movement may be prevented.

A growth temperature is set at 400° C.–520° C., preferably at 480° C.–510° C., more preferably at 480° C.–490° C. in which a re-evaporation of In is not supposed to cause and a PL spectrum becomes narrower. Under this condition, an n-type $Ga_{0.51}In_{0.49}P$ buffer layer 3 having a thickness of 0.25 $\mu$m, an n-type $(Al_{0.72}Ga_{0.28})_{0.51}In_{0.49}P$ cladding layer 4 having a thickness of 1.2 $\mu$m, $(Al_{0.72}Ga_{0.28})_{0.51}In_{0.49}P(500$ Å$)+[Ga_{0.48}In_{0.52}P(50$ Å$\times 4)+(Al_{0.5}Ga_{0.5})_{0.51}In_{0.49}P(50$ Å$\times 3)]+(Al_{0.5}Ga_{0.5})_{0.51}In_{0.49}P(500$ Å$)$ as a strained quantum well active layer 5, a first p-type $(Al_{0.72}Ga_{0.28})_{0.51}In_{0.49}P$ cladding layer 6 having a thickness of 0.17 $\mu$m, a p-type or non-dope $Ga_{0.62}In_{0.38}P$ etch-stop layer 7 having a thickness of 80 Å, a second p-type $(Al_{0.72}Ga_{0.28})_{0.51}In_{0.49}P$ cladding layer 8 having a thickness of 1.03 $\mu$m, and a p-type $Ga_{0.51}In_{0.49}P$ intermediate layer 9 having a thickness of 0.05 $\mu$m are successively stacked. In the present working example a layer of $Ga_{0.48}In_{0.52}P$ having a thickness 50 Å was selected for a strained quantum well active layer to obtain 650 nm as an oscillation wave-length.

Under a vacuum condition, the substrate 1 is again moved into a growth chamber where only As is used as a V-group element, a second conductive-type GaAs cap layer 10 is stacked at 500° C. in order to prevent P from evaporating out of stacked crystal. Then an $Al_2O_3$ layer 11 having a thickness of 0.15 $\mu$m is deposited on the p-type GaAs cap layer 10.

Subsequently, a resist layer 12 is applied on the $Al_2O_3$ layer 11, and a photoetching process is carried out to pattern the $Al_2O_3$ layer 11 to be a stripe-shape extending in [01-1] direction. Then, an etching process is carried out by using the $Al_2O_3$ layer 11 as a mask to partially remove the p-type GaAs cap layer 10, the p-type $Ga_{0.51}In_{0.49}P$ intermediate layer 9 and the second p-type $(Al_{0.72}Ga_{0.28})_{0.51}In_{0.49}P$ cladding layer 8 so as to form ridges beneath the $Al_2O_3$ layer 11.

For the above etching process, an etching solution of sulfuric acid:hydrogen peroxide aqueous solution:water= 1:2:20 (at 12° C.) was applied to the p-type GaAs cap layer 10, an etching solution of SBW (saturated bromine water):phosphoric acid:water=2:1:5 (at 20° C.) was applied to the second p-type $Ga_{0.5}In_{0.49}P$ intermediate layer 9 and an solution of phosphoric acid (at 70° C.) was applied to the second p-type $(Al_{0.72}Ga_{0.28})_{0.51}In_{0.49}InP$ cladding layer 8.

Note that each rate above is in weight and components of the solutions mentioned above are as follows:

Concentrated sulfuric acid ($H_2SO_4$): a guaranteed reagent by the Japanese Pharmacopoeia Hydrogen peroxide water solution ($H_2O_2$): a guaranteed reagent by the Japanese Pharmacopoeia Water ($H_2O$): pure water Saturated bromine water solution (SBW): a supernatant of a saturated bromine water solution with excessive bromine (i.e., undisolved excessive bromine remains in the bottom of the solution)

Figure 15:
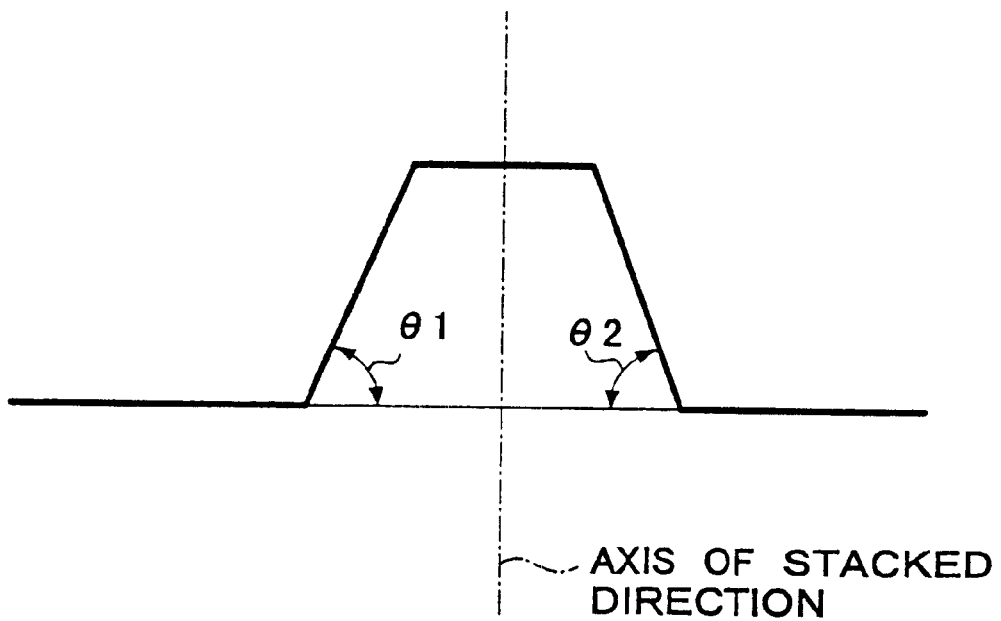
FIG. 15 illustrates a cross sectional view of a ridge stripe.

Phosphoric acid ($H_3PO_4$) : a- guaranteed reagent by the Japanese Pharmacopoeia Such chemical etching processes with the above etching solution provides a good crystal boundary between each side of the ridge and a GaAs current blocking layer which is to be formed at the next step. The chemical etching process also provides a cross-sectional ridge shape which is asymmetric along the axis of the stacked direction as shown in FIG. 15, because the main facet of the substrate is inclined by $\theta°$ in [011] direction from (100) facet. If a complete chemical etching is achieved, two acute angles among angles formed between the crystal facet and ridge sides are $\theta 1=54.7°-\theta°$ and $\theta 2=54.7°+\theta°$.

When the ridge is formed by mechanical processes such as ion-beam etching, the cross-sectional shape of the ridge may be symmetric along the stacking direction. However, this may result in mechanical damages at the ridge sides to cause a current leak between the ridge sides and the current blocking layer, that is, its current-blocking effect is affected. Therefore, it is preferable to apply a little chemical etching with an etching solution before growing a current blocking layer after the mechanical forming of ridge as well. This process is referred to as "rinsing". Such rinsing gives an asymmetric cross-sectional shape for the ridge, which is not so asymmetric as the ridge formed by such total chemical etching process.

As shown in FIG. 10, upon removal of the resist layer 12, a second growth by MBE process is achieved in a chamber where only As is used as a V-group element to form an n-type GaAs current blocking layer 13 having a thickness of 1.58 $\mu$m at both sides of the ridge at a growth temperature of 600° C. The growth temperature of 600° C. is selected as high as possible to give a good crystal quality in the n-type GaAs current blocking layer 13 such that the growth temperature should be within the range to prevent P or In from re-evaporating out of the p-type $Ga_{0.51}In_{0.49}P$ intermediate layer 9 of which surface is exposed and the second p-type $(Al_{0.72}Ga_{0.28})_{0.5}In_{0.49}P$ cladding layer 8 of which ridge sides are exposed. During the process a polycrystalline GaAs crystal 14 is formed on a surface of the $Al_2O_3$ layer 11.

Then, a resist layer 15 is applied by a spinner, wherein the resist 15 is applied onto the n-type GaAs current blocking layer 13, however the resist 15 is not substantially applied onto the polycrystalline GaAs crystal 14. Subsequently, the resist 15 on the whole surface of the array is ashed by $O_3$-UV ashing process to leave the resist 15 only on the n-type GaAs current blocking layer 13 as shown in FIG. 11. Then, the polycrystalline GaAs crystal 14 is removed by an etching process by using the resist 15 as a mask as shown in FIG. 12. The resist 15 is removed as shown in FIG. 13, and the $Al_2O_3$ layer 11 is also removed by etching. Then, the substrate is annealed at 700° C. for 2 hours in a nitrogen atmosphere. Such heat-annealing allows impurities in p-type semiconductor layers to be active and carrier densities in p-type semiconductor layers to be high. As is well-known, a high carrier density in a p-type semiconductor layer improves temperature characteristics of a semiconductor laser device.

Then, a third MBE growth is carried out in a growth chamber where only As is used as a V-group element to stack a p-type GaAs contact layer 16 by 4 $\mu$m at a growth temperature of 600° C. Finally, electrodes 17 and 18 are formed on the upper surface of such stacked array and on the back of the n-type GaAs substrate 1 to separate into individual devices in order to obtain AlGaInP-based semiconductor red-laser devices as shown in FIG. 14.

The present invention may be applied not only to the laser array as mentioned in the working example but also to semiconductor laser devices of various structures.

As described above, the present inventions provides the following advantages:

(1) In order to fabricate a semiconductor laser device emitting a laser beam of given wave-length, the present invention forms semiconductor layers by MBE process on a GsAs substrate having a facet to be the a main facet inclined by θ° in [011] direction from (100) facet such that the semiconductor layers include an AlGaInP cladding layer of which bandgap is $E_{gc}$ and an AlGaInP active layer of which bandgap $E_{ga}$ is adjusted by controlling the amount of III-group elements to be represented by $E_{ga} < E_{gc}$, whereby a PL spectrum of the AlGaInP-based semiconductor layer is narrower and its growth temperature may be raised up to 520° C. which is the evaporation temperature of In. That is, an InGaAlP layer of improved crystal qualities may be grown.

(2) The present invention also provides a semiconductor laser device of good characteristics such as a lower oscillation threshold, a high efficiency in light emission.

(3) Further, an AlGaInP cladding layer of high reactivity is grown not immediately on a GaAs substrate having a main facet inclined by 7°–15° in [011] direction from (100) facet but on a buffer to be grown into and made of GaAs or GaInP by MBE process, whereby less influence by impurities on GaAs substrate surface may be effected, an improved morphology is maintained for growing an AlGaInP-based semiconductor layer thereon and crystal defects may be decreased.

(4) Since a direction of a ridge stripe is selected to be along [01-1] direction which orthogonally crosses the inclining direction of the main facet, the ridge becomes an ordinary mesa-shape. A crystal may be grown to cover the ridge without leaving a space so as to provide a semiconductor laser device having an improved optical characteristic which does not deteriorate even if an air penetrates through a gap. An end surface formed by cleavage and an end surface of a light waveguide within a semiconductor laser device become perpendicular to each other and the laser device may be used as a light-source for optical disc systems.

(5) Since a growth temperature may be 400° C.–520° C., the present invention provides a crystal quality maintained in a good condition, while In does not re-evaporate, whereby a compound crystal ratio is easily controlled, and a semiconductor laser device maintaining a preset oscillation wave-length is easily fabricated.

Many variations will be readily envisaged by a skilled person in the art, and the scope of the present invention is in not limited to the specifics of the above embodiment.

What is claimed is:

1. A method for fabricating a semiconductor laser device, comprising the steps of:

stacking a cladding layer of bandgap $E_{gc}$ made of III-V group compound semiconductor layer and an active layer of bandgap $E_{ga}$ on a substrate having a facet, which is to be a main facet, inclined by θ° in [011] direction from (100) facet that formed a ridge stripe;

extending the ridge stripe in [01-1] direction; and chemically fabricating the ridge stripe by chemically etching.

2. The method for fabricating a semiconductor laser device as defined in claim 1, wherein III-V group compound semiconductor layers including the cladding layer and the active layer are formed by MBE process.

3. The method for fabricating a semiconductor laser device as defined in claim 2, wherein a growth temperature of GaInP, AlGaInP semiconductor layers by the MBE process is between 400° C. and 520° C.

4. A method for fabricating a semiconductor laser device, wherein semiconductor layers including an AlGaInP cladding layer of bandgap $E_{gc}$ and an AlGaInP active layer of bandgap $E_{ga}$ adjusted by an amount of III-group element to be represented by $E_{ga} < E_{gc}$ are formed by MBE process on a substrate having a facet, which is to be a main facet, inclined by θ° in [011] direction from (100) facet.

5. A method for fabricating a semiconductor laser device, comprising the steps of:

forming a buffer layer made of GaAs by MBE process on a GaAs substrate having a facet, which is to be a main facet, inclined by θ° in [011] direction from (100) facet; then forming semiconductor layers by MBE process, the semiconductor layers including an AlGaInP cladding layer of bandgap $E_{gc}$ and an AlGaInP active layer of bandgap $E_{ga}$ adjusted by an amount of III-group element to be represented by $E_{ga} < E_{gc}$.

6. A method for fabricating a semiconductor laser device, comprising the steps of:

forming a buffer layer made of GaAs and a buffer layer made of GaInP by MBE process on a GaAs substrate having a facet, which is to be a main facet, inclined by θ° in [011] direction from (100) facet; and then forming semiconductor layers by MBE process, the semiconductor layers including an AlGaInP cladding layer of bandgap $E_{gc}$ and an AlGaInP active layer of bandgap $E_{ga}$ adjusted by an amount of III-group element to be represented by $E_{ga} < E_{gc}$.

7. The method for fabricating a semiconductor laser device as defined in claim 4, wherein the semiconductor laser device includes a ridge stripe of which extending direction is [01-1] direction.

8. The method for fabricating a semiconductor laser device as defined in claim 4, wherein the inclined angle θ° in [011] direction from (100) facet is between 7° and 15°.

* * * * *